(12) United States Patent
Sato et al.

(10) Patent No.: US 6,717,482 B2
(45) Date of Patent: Apr. 6, 2004

(54) OSCILLATOR CIRCUIT AND INTEGRATED CIRCUIT FOR OSCILLATION

(75) Inventors: Masatoshi Sato, Nasu-gun (JP); Kenichi Sato, Nasu-gun (JP)

(73) Assignee: Nippon Precision Circuits Inc., Tokyo (JP)

(*) Notice: Subject to any disclaimer, the term of this patent is extended or adjusted under 35 U.S.C. 154(b) by 30 days.

(21) Appl. No.: 10/261,220

(22) Filed: Sep. 30, 2002

(65) Prior Publication Data

US 2003/0090297 A1 May 15, 2003

(30) Foreign Application Priority Data

Nov. 9, 2001 (JP) ......................................... 2001-344024

(51) Int. Cl.[7] ............................... H03B 5/32; H03B 5/36
(52) U.S. Cl. .................. 331/154; 331/116 R; 331/158; 331/175; 331/177 V
(58) Field of Search ...................... 331/116 R, 116 FE, 331/116 M, 154, 158, 175, 177 R, 177 V

(56) References Cited

U.S. PATENT DOCUMENTS 6,225,871 B1 * 5/2001 Chien .................... 331/117 FE
6,292,064 B1 * 9/2001 Nagata ................. 331/117 FE

FOREIGN PATENT DOCUMENTS

JP    04134913 A  *  5/1992

* cited by examiner

*Primary Examiner*—David Mis
(74) *Attorney, Agent, or Firm*—Jordan and Hamburg LLP

(57) ABSTRACT

A neutralization of an equivalent parallel capacitor of a piezoelectric resonator is realized to obtain a stable activation of oscillation and secure a large frequency variation. A crystal resonator is connected between an input and output terminals of an inverting amplifier to form a Colpitts-type oscillator circuit, an input terminal of another inverting amplifier is connected to the output terminal through a capacitor and the output terminal is connected to the input terminal through another capacitor to form a Miller capacitor circuit for electrically neutralizing a parallel capacitor existing equivalently between both sides of the crystal resonator.

6 Claims, 3 Drawing Sheets

A                                      B

OSCILLATOR CIRCUIT AND INTEGRATED CIRCUIT FOR OSCILLATION

BACKGROUND OF THE INVENTION

1. Field of the Invention

The present invention relates to an oscillator circuit and integrated circuit for oscillation using a piezoelectric resonator such as a crystal resonator, particularly relates to the oscillator circuit and integrated circuit for oscillation to which a circuit for neutralizing an equivalent parallel capacitor of the piezoelectric resonator is added.

2. Description of the Prior Art

A typical Colpitts-type crystal oscillator circuit employs a constitution in which, for example as shown in FIG. 3, the crystal resonator 31 is connected between an input and output terminals of an inverting amplifier 32 for amplifying the oscillation and a load capacitor 33 is connected to either end of the crystal resonator 31 for the oscillation.

In the Colpitts-type oscillator circuit shown in FIG. 3, the crystal resonator 31 is shown like FIG. 4A in an equivalent circuit, and the entire oscillation circuit is shown like FIG. 4B in the equivalent circuit. The crystal resonator 31 comprises the equivalent parallel capacitor C0, a resistance R1 (crystal impedance), an equivalent series capacitor C1, and an inductor L1. The oscillation circuit comprises a negative resistance -R, a resistance Re as an effective resistance of the crystal resonator, a capacitor CL comprising the load capacitor, and the inductor L.

When the equivalent parallel capacitor C0, resistance R1, capacitor CL, and resistance Re are expressed in respective symbols, the resistance Re is given as follows:

$$Re = R1 \cdot (1 + C0/CL)^2$$

The oscillation continues as long as the sum of the resistance Re and negative resistance -R in the equivalent circuit of FIG. 4B is a negative value. However, while the equivalent parallel capacitor C0 and resistance R1 tend to increase with increase of frequency of the oscillation in the oscillator circuit of FIG. 3, the negative resistance -R in the entire circuit decreases in inverse proportion to the square of the frequency, resulting in difficult activation of the oscillation.

Moreover, when a varicap diode is connected parallel to the load capacitor 33 to form a voltage controlled oscillator circuit, in case the equivalent parallel capacitor C0 is large, frequency variation $\Delta f/f_0$ with the capacitor CL being varied becomes small. When the equivalent parallel capacitor C0, equivalent series capacitor C1, and capacitor CL are expressed in respective symbols, the variation $\Delta f/f_0$ is given as follows:

$$\Delta f/f_0 = C1/(2 \cdot (C0 + CL))$$

To solve these problems, there is an attempt to neutralize the equivalent parallel capacitor C0. As a method, it has been commonly done in the prior art that an inductive reactance (coil) is added parallel to the crystal resonator. However, the method has a drawback that volume of the component is too large. Moreover, it is difficult to integrate the coil on the integrated circuit except for a special case. As the circuit for neutralizing the equivalent parallel capacitor, there is a widely used circuit of adding a feedback capacitor to compensate an input capacitance when a differential amplification circuit is used. However, since the circuit is realized by using a differential amplifier, it involves a significant delay to be disadvantageous in speeding up for application to the oscillator circuit, and a complicated constitution.

Therefore, the invention intends to achieve the neutralization of the equivalent parallel capacitor C0 of the piezoelectric resonator in a simple constitution to avoid increase of the effective resistance Re of the piezoelectric resonator and keep the value of Re sufficiently smaller than that of the negative resistance -R to activate the oscillation stably, and secure a sufficiently large variation $\Delta f/f_0$ by neutralizing the equivalent parallel capacitor C0 when the voltage controlled oscillator circuit is formed.

SUMMARY OF THE INVENTION

The oscillator circuit of the invention, which is the Colpitts-type oscillator circuit having the piezoelectric resonator such as the crystal resonator and a first inverting amplifier having the input and output terminals connecting the piezoelectric resonator between them, is characterized in having a Miller capacitor circuit, which comprises a second inverting amplifier having an input side connected to the output terminal and an output side connected to the input terminal through the capacitor, for electrically neutralizing the parallel capacitor existing equivalently between both sides of the piezoelectric resonator.

Preferably, the second inverting amplifier comprises a bipolar transistor and determines a gain using a resistive divider.

Also, the second inverting amplifier preferably comprises a CMOS inverter and determines the gain using the resistive divider.

Also, the oscillator circuit is preferably integrated in a single integrated circuit for oscillation except for the piezoelectric resonator.

DESCRIPTION OF THE PREFERRED EMBODIMENTS

Hereinafter, preferred embodiments of the invention will be described in detail with reference to the attached drawings.

Figure 1:
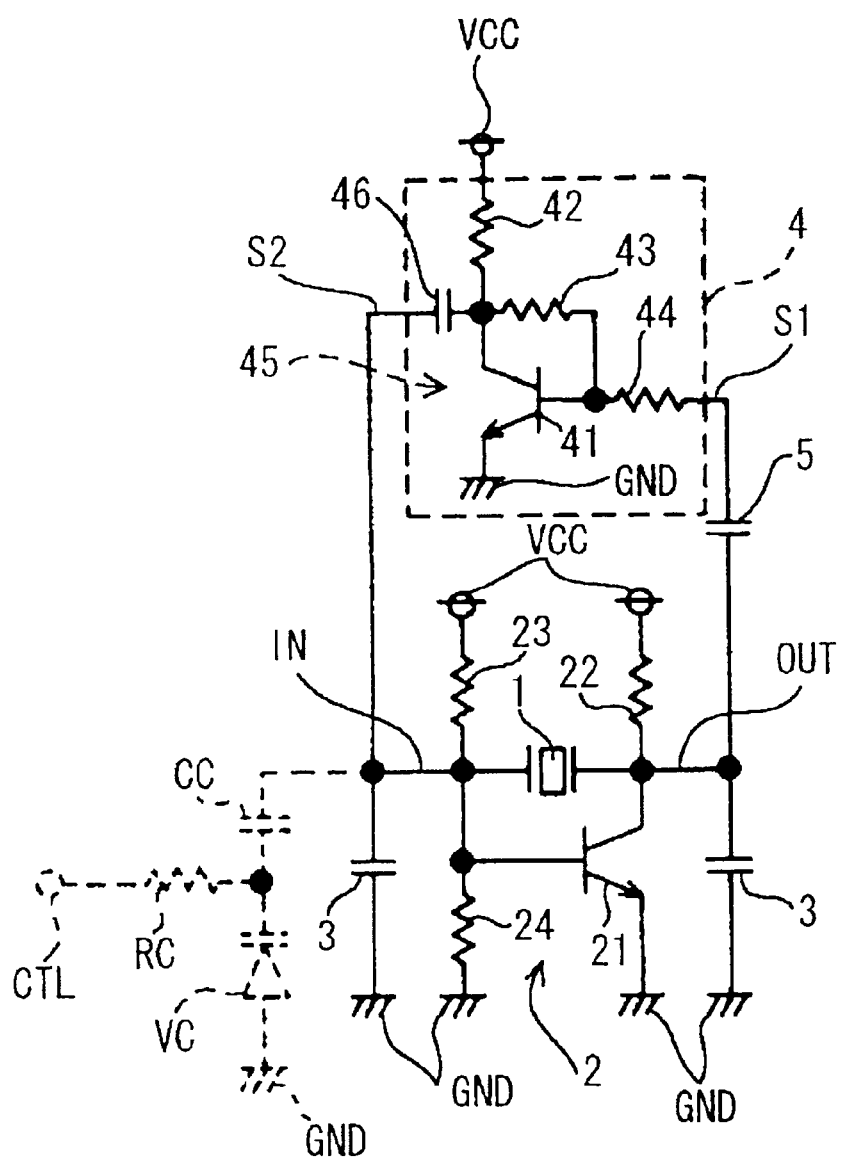
FIG. 1 is an electric circuit diagram showing the constitution of the oscillator circuit of the first example of the invention.

The oscillator circuit and integrated circuit for oscillation of the first example of the invention are described with reference to FIG. 1. The crystal resonator 1 as the piezoelectric resonator is connected between the input terminal IN and output terminal OUT of the inverting amplifier 2. The inverting amplifier 2 has the input terminal IN connected to the base of a npn bipolar transistor 21 and the output terminal OUT connected to the collector of that. The emitter of the bipolar transistor 21 is connected to a power-supply terminal GND (for example, 0V), the collector is connected to another power-supply terminal VCC (for example, 3V) through the resistor 22, and the base is connected to a mutual connection point of the resistors 23, 24 connected in series between the power-supply terminals VCC and GND and then biased to form the inverting amplifier 2. Each of the load capacitors 3, 3 is connected between the input terminal IN or the output terminal OUT and the power-supply terminal GND. The constitution is similar to that of the Colpitts-type crystal oscillator circuit using the inverting amplifier comprising the bipolar transistor in the prior art.

Figure 4:
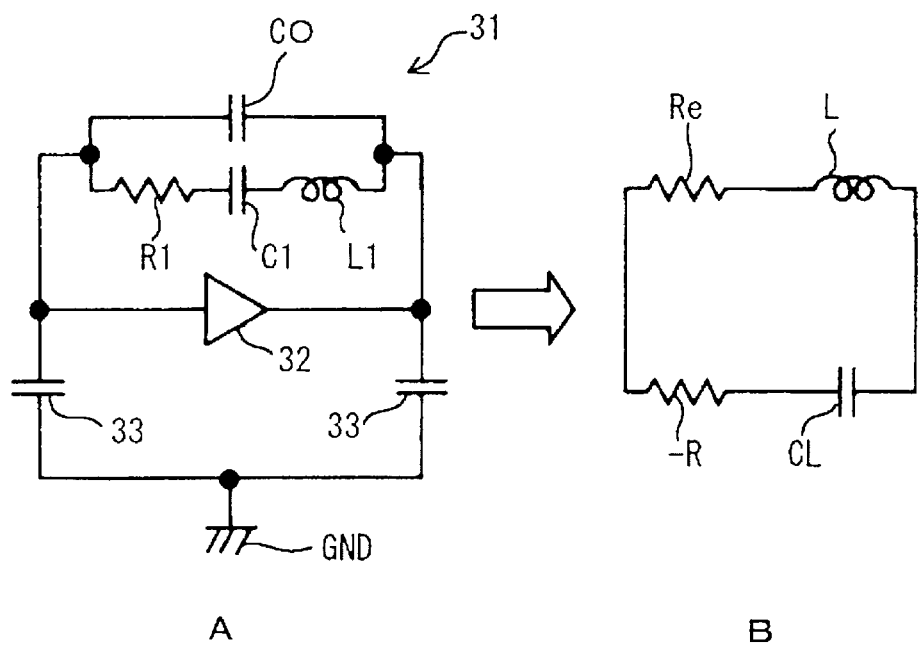

The Miller capacitor circuit 4 comprises the inverting amplifier 45 in which the emitter of the npn bipolar transistor 41 is connected to the power-supply terminal GND, the collector is connected to the power-supply terminal VCC through the resistor 42, a feedback resistor 43 is connected between the collector and the base, and an input resistor 44 is connected to the base, and the capacitor 46 connected to the collector as the output terminal of the inverting amplifier 45. The input terminal S1 of the Miller capacitor circuit 4 is connected to the output terminal OUT of the inverting amplifier 2 through the capacitor 5 for direct-current cutoff, and the output terminal S2 of the Miller capacitor circuit 4 is connected to the input terminal IN of the inverting amplifier 2. A neutralizing capacitance between the input terminal S1 and output terminal S2 of the Miller capacitor circuit 4 neutralizes the equivalent parallel capacitor C0 (refer to FIG. 4) of the crystal resonator.

The components are integrated in a single integrated circuit for oscillation except for the crystal resonator 1 which is connected between the input terminal IN and output terminal OUT through an external terminal, not shown, to form the oscillator circuit. Alternatively, while the npn bipolar transistor is used in this example, a pnp bipolar transistor may also be used, and the polarity of the power-supply terminal is reversed in that case.

Next, an operation of this example is described. Assuming that the amplification degree of the inverting amplifier 45 is −A, the value C' of a neutralizing capacitance between the input terminal S1 and output terminal S2 of the Miller capacitor circuit 4 is given by C'=−A·C using the amplification degree −A and the value C of the capacitor 46. The amplification degree −A is determined by the ratio of the values of the feedback resistor 43 to the input resistor 44, that is, assuming that the values of the feedback resistor 43 and the input resistor 44 are $R_{43}$ and $R_{44}$ respectively, it is given by −A=−($R_{43}/R_{44}$). Therefore, the value C' of the neutralizing capacitance can be determined freely using the value C of the capacitor 46 and the resistance ratio $R_{43}/R_{44}$ of the feedback resistor 43 to the input resistor 44.

Here, for example, when the ratio of the value $R_{43}$ of the feedback resistance 43 to the value $R_{44}$ of the input resistance 44 is set 2/1, the amplification degree −A is −2, so that the value C' of the neutralizing capacitance is given by C'=−2·C. Here, assuming that either capacitance value of the equivalent parallel capacitor C0 of the crystal resonator 1 and the capacitor 46 of the Miller capacitor circuit 4 is C, the value of the parallel-added capacitance is 2·C because the equivalent parallel capacitor of the crystal resonator 1 and the capacitor 46 of the Miller capacitor circuit 4 are connected parallel between the base and collector of the bipolar transistor 21 forming the inverting amplifier in the oscillator circuit. When the value of the neutralizing capacitance −2·C is added to this capacitance, the capacitance value is canceled out zero, thereby the equivalent parallel capacitor of the crystal resonator 1 can be neutralized. The connected end of the capacitor 5 is the input resistor 44 which has a resistance value high enough not to affect substantially on the oscillator circuit, thus the capacitor 5 is negligible in the oscillator circuit.

In this example, since the equivalent parallel capacitor C0 of the crystal resonator 1 can be neutralized, and the effective resistance Re of the crystal resonator in FIG. 4B can be optionally reduced in the Miller circuit 4 added to the oscillator circuit, the stable activation of the oscillation is possible. Further, it is possible to secure a sufficiently large frequency variation $\Delta f/f_0$ by neutralizing the equivalent parallel capacitor C0 when the voltage control oscillation circuit is formed. The voltage controlled oscillator circuit can be formed, for example, by connecting the capacitor CC and the varicap diode VC in series between the input terminal IN and power-supply terminal GND as shown in the broken line in FIG. 1, and applying the control voltage from a control terminal CTL to the cathode of the varicap diode VC through the resistor RC. The oscillator circuit of this example, without limiting to this, is applicable to various other circuits including the circuit using a capacitor array as the load capacitor.

Figure 2:
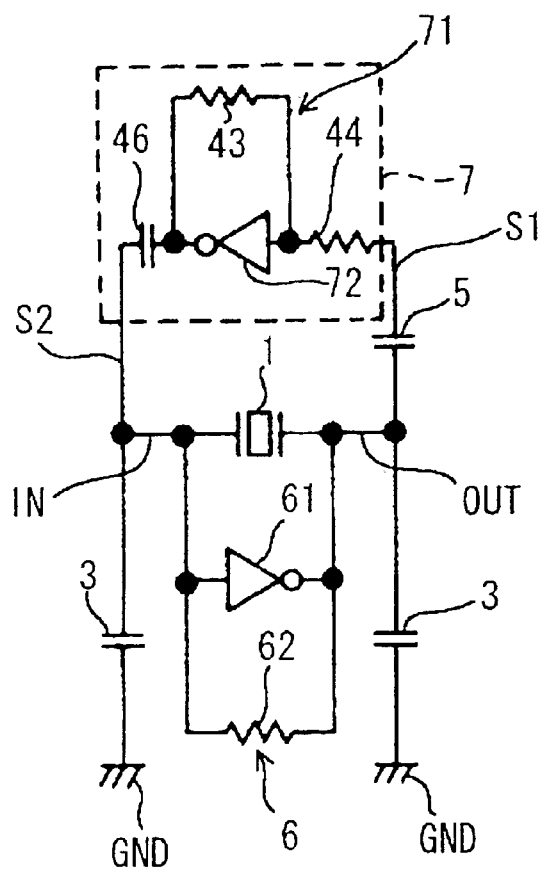
FIG. 2 is the electric circuit diagram showing the constitution of the oscillator circuit of the second example of the invention.
Figure 3:
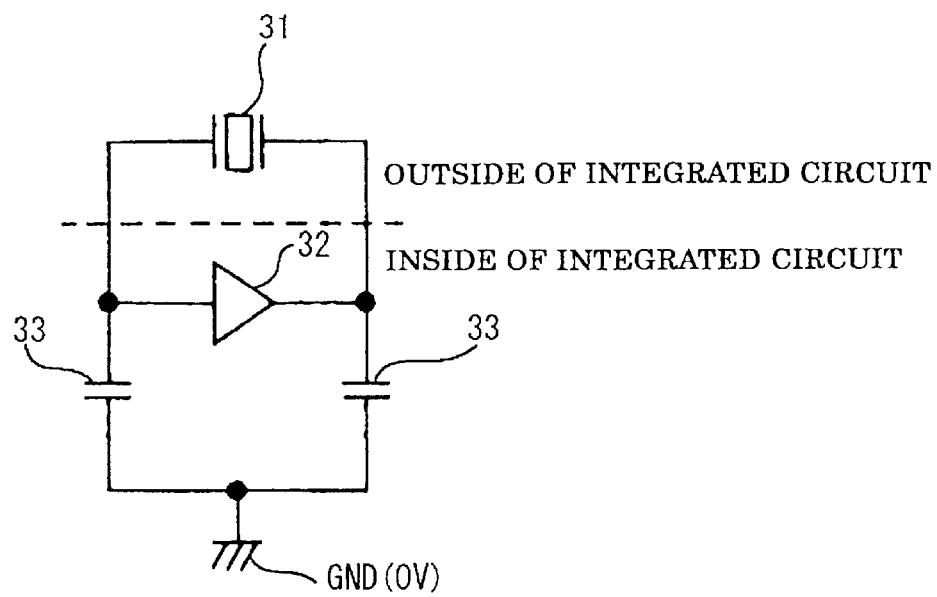
FIG. 3 is the electric circuit diagram showing the constitution of the oscillator circuit in the prior art, and, FIG. 4 is the electric circuit diagram showing the equivalent circuit of the oscillator circuit in the prior art.

Next, the oscillator circuit and integrated circuit for oscillation of the second example of the invention are described with reference to FIG. 2. Although the oscillator circuit configured with the bipolar transistor was described in the first example, the invention is not limited to this and also applicable to the oscillator circuit using the CMOS inverter. This example will show an application to the oscillator circuit using the CMOS inverter. In FIG. 2, equal symbols indicate equal components to those in FIG. 1. In the amplifier 6, the feedback resistor 62 is connected between the input terminal IN and output terminal OUT of the CMOS inverter 61. The crystal resonator 1 is connected between the input terminal IN and output terminal OUT of the CMOS inverter 61. The CMOS inverter 72 is used for the inverting amplifier 71 of the Miller capacitor circuit 7. The mirror capacitor circuit 7 has the input terminal S1 connected to the output terminal OUT of the CMOS inverter 61 through the capacitor 5 for DC cutoff, and the output terminal S2 connected to the input terminal IN of the CMOS inverter 61, the circuit 7 being inserted parallel to the crystal resonator 1.

Next, the operation of this example is described. For example, when the value of the capacitor 46 is set equal to the value of the equivalent parallel capacitor C0 of the crystal resonator 1, and the ratio of the resistance value $R_{43}$ of the feedback resistor 43 to the resistance value $R_{44}$ of the input resistor 44 is set 2/1, the amplification degree −A of the inverting amplifier 71 of the Miller capacitor circuit 7 is −2, thus the neutralizing capacitance C' is −2·C. The value of the parallel-added capacitance is 2·C because the equivalent parallel capacitor C0 of the crystal resonator 1 and the capacitor 46 of the Miller capacitor circuit 7 are connected parallel between the input terminal IN and output terminal OUT of the CMOS inverter 61, therefore the capacitance is canceled out zero when the value of C'=−2·C of the neutralizing capacitance is added, consequently the equivalent parallel capacitor C0 of the crystal resonator 1 can be neutralized.

Therefore, again in this example, similar function or advantage can be obtained from the similar operation as in the first example.

Moreover, although the crystal resonator is intentionally used as the piezoelectric resonator in each of the examples, the invention, not limited to this, may use any piezoelectric oscillator having the equivalent parallel capacitor C0 as shown in FIG. 4A, and is applicable to any oscillator circuits using these piezoelectric resonators.

According to the invention, since the Miller capacitor circuit added to the oscillation circuit neutralizes the equivalent parallel capacitor of the piezoelectric resonator such as the crystal resonator, the effective resistance of the piezoelectric resonator such as the crystal resonator can be reduced optionally by adjusting setting of the Miller capacitor circuit, consequently stable activation of the oscillation is possible.

Moreover, it is possible to increase the frequency variation, which is variable with variation of the load capacitor, by adjusting the setting of the Miller capacitor circuit added to the oscillator circuit, consequently it is possible to increase the frequency variation in the voltage controlled oscillator circuit.

Moreover, the simple constitution based on the use of the simple inverting amplifier enables a fast operation. Further, the circuit size can be reduced to improve the integration density of the integrated circuit for oscillation because the amplifier is realized using a combination of the capacitors, resistors, and transistors.

What is claimed is:

1. An oscillator circuit, which is a Colpitts-type oscillation circuit having a piezoelectric resonator such as a crystal resonator and a first inverting amplifier having an input and output terminals connecting the piezoelectric resonator between them, comprising, a Miller capacitor circuit including a second inverting amplifier having an input side connected with said output terminal and an output side connected with said input terminal through a capacitor, and electrically neutralizing a parallel capacitor existing equivalently between both sides of the piezoelectric resonator.

2. An oscillator circuit according to claim 1, wherein the second inverting amplifier comprises a bipolar transistor and determines a gain using a resistive divider.

3. An oscillator circuit according to claim 1, wherein the second inverting amplifier comprises a CMOS inverter and determines the gain using the resistive divider.

4. An integrated circuit for oscillation, which has a terminal to which a piezoelectric resonator such as a crystal resonator is connected externally and a first inverting amplifier having an input and output terminals connecting said piezoelectric resonator between them, and is connected to said piezoelectric resonator externally to form a Colpitts-type oscillator circuit, comprising, a Miller capacitor circuit including a second inverting amplifier having an input side connected to said output terminal and an output side connected to said input terminal through a capacitor, and electrically neutralizing a parallel capacitor existing equivalently between both sides of said piezoelectric resonator.

5. An integrated circuit for oscillation according to claim 4, wherein said second inverting amplifier comprises a bipolar transistor and determines a gain using a resistive divider.

6. An integrated circuit for oscillation according to claim 4, wherein said second inverting amplifier comprises a CMOS inverter and determines a gain using a resistive divider.

* * * * *